(12) United States Patent
Yonemura

(10) Patent No.: US 8,820,896 B2
(45) Date of Patent: Sep. 2, 2014

(54) DROPLET EJECTING HEAD, DROPLET EJECTING APPARATUS, PIEZOELECTRIC DEVICE, AND CERAMIC

(75) Inventor: Takayuki Yonemura, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 343 days.

(21) Appl. No.: 12/858,672

(22) Filed: Aug. 18, 2010

(65) Prior Publication Data

US 2011/0043574 A1 Feb. 24, 2011

(30) Foreign Application Priority Data

Aug. 19, 2009 (JP) .................. 2009-189827
Mar. 11, 2010 (JP) .................. 2010-054885

(51) Int. Cl.
*B41J 2/045* (2006.01)
*H01L 41/187* (2006.01)
*C04B 35/453* (2006.01)
*B41J 2/14* (2006.01)

(52) U.S. Cl.
CPC ........... *B41J 2/1433* (2013.01); *H01L 41/1878* (2013.01); *C04B 35/453* (2013.01)
USPC .................. 347/71; 310/358; 252/62.9 R

(58) Field of Classification Search
None
See application file for complete search history.

(56) References Cited

U.S. PATENT DOCUMENTS

| 7,525,239 B2 * | 4/2009 | Aoki et al. .................... 310/358 |
| 7,586,234 B2 | 9/2009 | Miyazawa et al. |
| 2009/0085445 A1 | 4/2009 | Kobayashi et al. |
| 2009/0230211 A1 * | 9/2009 | Kobayashi et al. ........ 239/102.2 |
| 2011/0007115 A1 | 1/2011 | Kobayashi et al. |

FOREIGN PATENT DOCUMENTS

| EP | 1990326 | 11/2008 |
| JP | 2001-223404 | 8/2001 |
| JP | 2007-134566 | 5/2007 |
| JP | 2007-221066 | 8/2007 |
| JP | 2007-287745 | 11/2007 |
| JP | 2008-069051 | 3/2008 |
| JP | 2011-035385 | 2/2011 |

* cited by examiner

*Primary Examiner* — Jerry Rahll
(74) *Attorney, Agent, or Firm* — Workman Nydegger

(57) ABSTRACT

A droplet ejecting head including: a pressure chamber connected to a nozzle hole; and a piezoelectric device having ceramic member provided with an electrode. The ceramic member is made from a solid solution containing bismuth ferrate, bismuth potassium titanate, and bismuth manganate.

5 Claims, 9 Drawing Sheets

0 mol% (β=0)

2 mol% (β=0.02)

4 mol% (β=0.04)

8 mol% (β=0.08)

x = 0.6
STRAIN AMOUNT = 1.13 nm
STRAIN RATE = 0.15% x = 0.5
STRAIN AMOUNT = 1.32 nm
STRAIN RATE = 0.18% x=0.7
STRAIN AMOUNT=1.36 nm
STRAIN RATE=0.18% x=0.6
STRAIN AMOUNT=2.08 nm
STRAIN RATE=0.26% x=0.5
STRAIN AMOUNT=2.26 nm
STRAIN RATE=0.27% x=0.4
STRAIN AMOUNT=1.99 nm
STRAIN RATE=0.22%

DROPLET EJECTING HEAD, DROPLET EJECTING APPARATUS, PIEZOELECTRIC DEVICE, AND CERAMIC

CROSS-REFERENCE TO RELATED APPLICATIONS

This application claims the benefit of priority to Japanese Patent Application No. 2009-189827 filed Aug. 19, 2009, and Japanese Patent Application No. 2010-054885 filed Mar. 11, 2010, the contents of which are hereby incorporated by reference in their entirety.

BACKGROUND

1. Technical Field

The present invention relates to a droplet ejecting head, a droplet ejecting apparatus, a piezoelectric device, and a ceramic.

2. Related Art

A droplet ejecting apparatus, typified by an ink jet printer, is provided with a droplet ejecting head that ejects liquid. A typical example of the droplet ejecting head includes an ink jet recording head in which a piezoelectric actuator is operated to deform a pressure chamber with the result that ink contained in the pressure chamber is pressurized to be ejected as ink droplets from a nozzle hole. JP-A-2001-223404 discloses the piezoelectric actuator used in the ink jet recording head, and the disclosed piezoelectric actuator includes a piezoelectric ceramic that exhibits an electromechanical conversion function and that is disposed between electrodes. Piezoelectric devices, typified not only by the piezoelectric actuator but also by a piezoelectric sensor and various ultrasonic devices, are used in various apparatuses.

However, in view of environmental problems, lead-free (or low lead content) ceramic materials that are capable of exhibiting sufficiently good piezoelectric properties are currently being developed in order to replace lead zirconate titanate, which is typically used as a piezoelectric material. For example, in JP-A-2008-069051, a ceramic containing bismuth ferrate and bismuth potassium titanate is proposed as a lead-free piezoelectric ceramic.

Unfortunately, in cases where the ceramic containing bismuth ferrate and bismuth potassium titanate is used in a piezoelectric device, a problem of a high leakage current occurs.

SUMMARY

An advantage of some aspects of the invention is that it provides a piezoelectric device having a low environmental burden and a decreased leakage current, a droplet ejecting head including the piezoelectric device, and a droplet ejecting apparatus including the droplet ejecting head.

According to an aspect of the invention, there is provided a droplet ejecting head including a pressure chamber connected to a nozzle hole and including a piezoelectric device having a ceramic member provided with an electrode. The ceramic member is made from a solid solution containing bismuth ferrate, bismuth potassium titanate, and bismuth manganate.

By virtue of this advantage, a droplet ejecting head including a piezoelectric device having a low environmental burden and a decreased leakage current is capable of being provided.

It is preferable that the ceramic member have a composition of $x(BiFeO_3)$-$(1-x)[(Bi_aK_{1-a})TiO_3]$-$y(BiMnO_3)$ (provided $0.4 \leq x \leq 0.7$, $0 < y \leq 0.045$, and $0.4 < a < 0.6$).

Hereinafter, $BiMnO_3$ is referred to as BM for short, and the ceramic member having the composition represented by $x(BiFeO_3)$-$(1-x)[(Bi_aK_{1-a})TiO_3]$-$y(BiMnO_3)$ (provided $0.4 \leq x \leq 0.7$, $0 < y \leq 0.045$, and $0.4 < a < 0.6$) is referred to as BF-BKT-BM ceramic.

According to another aspect of the invention, there is provided a droplet ejecting apparatus including the droplet ejecting head having any one of the above advantages.

According to another aspect of the invention, there is provided a piezoelectric device including a ceramic member provided with an electrode. The ceramic member is made from a solid solution containing bismuth ferrate, bismuth potassium titanate, and bismuth manganate.

By virtue of this advantage, a piezoelectric device having a low environmental burden and a decreased leakage current is capable of being provided.

According to another aspect of the invention, there is provided ceramic made from a solid solution containing bismuth ferrate, bismuth potassium titanate, and bismuth manganate.

By virtue of this advantage, ceramic used as a material of a piezoelectric device or the like having a low environmental burden and a decreased leakage current is capable of being provided.

BRIEF DESCRIPTION OF THE DRAWINGS

The invention will be described with reference to the accompanying drawings, wherein like numbers reference like elements.

DESCRIPTION OF EXEMPLARY EMBODIMENTS

An example of an embodiment to which the invention is applied will be described hereinafter with reference to the accompanying drawings. However, the invention is not limited to the following embodiment. The invention may include appropriate combinations of the following embodiment and modifications thereof. Bismuth ferrate ($BiFeO_3$), bismuth potassium titanate [$(Bi_aK_{1-a})TiO_3$], and bismuth manganate ($BiMnO_3$) are respectively herein referred to as BF, BKT, and BM for short.

1. Precursor Solution of Ceramic and Manufacturing Process of Ceramic

A precursor solution of a ceramic according to the embodiment and a process for manufacturing the ceramic will be described with reference to the accompanying drawings.

Figure 1A:
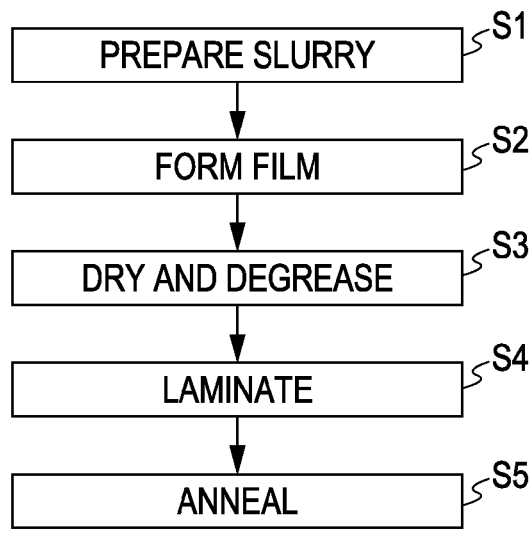
FIG. 1A is a flowchart illustrating a manufacturing process of ceramic according to an embodiment of the invention.
Figure 1B:
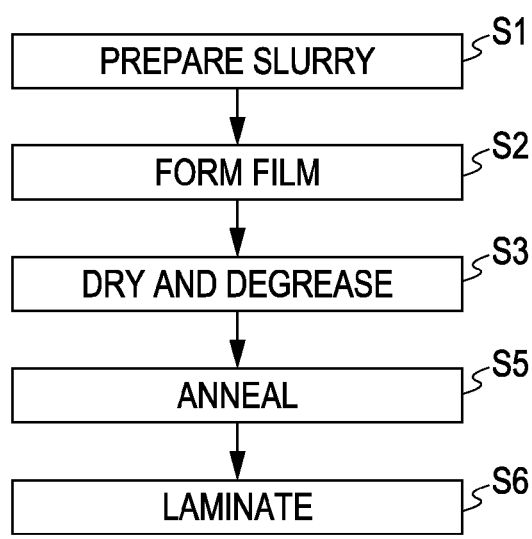
FIG. 1B is a flowchart illustrating a process for manufacturing the ceramic according to the embodiment of the invention.

FIGS. 1A and 1B are flowcharts each illustrating the process for manufacturing the ceramic according to the embodiment.

With reference to FIGS. 1A and 1B, the process for manufacturing the ceramic according to the embodiment includes: preparing a precursor solution; forming a first film with the precursor solution; heating the first film to produce a second film; stacking a plurality of the second films to form a laminate; and annealing the laminate.

1-1. Precursor Solution Preparation (S1)

The precursor solution of the ceramic according to the embodiment is a starting material in the process for manufacturing the ceramic, and the precursor solution is first prepared as illustrated in FIG. 1A (S1). The precursor solution of the ceramic according to the embodiment contains a metallic compound. The metallic compound contained in the precursor solution may have metallic elements that are appropriate for a BF-BKT-BM ceramic. BF, BKT, and BM, which are each represented by the general formula $ABO_3$ and which have the Perovskite crystal structure, form the BF-BKT-BM ceramic in which three crystal phases are mixed. In $BiFeO_3$, that is, BF, the site A is occupied by Bi, and the site B is occupied by Fe. In $(Bi_aK_{1-a})TiO_3$, that is, BKT, the site A is occupied by Bi and K, and the site B is occupied by Ti. In $BiMnO_3$, that is, BM, the site A is occupied by Bi, and the site B is occupied by Mn. Namely, the precursor solution of the BF-BKT-BM ceramic according to the embodiment may contain metallic elements including Bi, Fe, Ti, K, and Mn in a predetermined molar ratio. The molar-ratio of the metallic elements, which are contained in the precursor solution of the BF-BKT-MB ceramic according to the embodiment and which include Bi, Fe, Ti, K, and Mn, will be described hereinafter in detail.

A metallic compound used to prepare the precursor solution of the BF-BKT-BM ceramic is not specifically limited in so far as the metallic compound contains Bi, Fe, Ti, K, and Mn. The metallic compound used to prepare the precursor solution is not also limited in so far as the metallic compound is capable of being hydrolyzed and oxidized to produce a metallic oxide derived from an organic metal compound thereof, and, for example, the metallic compound may be selected from a metallic alkoxide, an organometallic complex, and an organic acid salt, which contain the above metallic element.

Examples of the metallic compound containing Bi include triethoxybismuth, tri-i-propoxybismuth, bismuth acetylacetonate, bismuth nitrate, bismuth acetate, bismuth citrate, bismuth oxalate, bismuth tartrate, and bismuth 2-ethylhexanoate. Examples of the metallic compound containing Fe include triethoxyiron, tri-i-propoxyiron, tris(acetylacetonato)iron, iron nitrate, iron acetate, iron oxalate, iron tartrate, iron citrate, and ferric 2-ethylhexanoate. Examples of the metallic compound containing Ti include tetramethoxytitanium, tetraethoxytitanium, tetra-i-propoxytitanium, tetra-n-propoxytitanium, tetra-i-butoxytitanium, tetra-n-butoxytitanium, tetra-t-butoxytitanium, titanium acetylacetonate, titanium nitrate, titanium acetate, titanium oxalate, titanium tartrate, titanium citrate, and tetra(2-ethylhexyl) titanate. Examples of the metallic compound containing K include potassium methanolate, potassium ethanolate, potassium i-propoxide, potassium n-propoxide, potassium i-butoxide, potassium n-butoxide, potassium t-butoxide, potassium nitrate, potassium acetate, potassium oxalate, potassium tartrate, potassium citrate, and potassium 2-ethylhexanoate. Examples of the metallic compound containing Mn include manganese di-i-propoxide, manganese(III) acetylacetonate, manganese nitrate, manganese acetate, manganese citrate, manganese oxalate, manganese tartrate, and manganese 2-ethylhexanoate.

An organic solvent used in the precursor solution according to the embodiment is not specifically limited. For example, organic solvents such as butanol, methanol, ethanol, propanol, xylene, octane, toluene, 2-methoxyethanol, 2-butoxyethanol, ethylene glycol, propylene glycol, and acetylacetone may be used.

The precursor solution according to the embodiment is prepared with the above metallic compounds so as to contain metallic elements having a molar ratio of $Bi:K:Fe:Ti:Mn = x+(1-x) \times a + y : (1-x) \times (1-a) : x : 1-x : y$ (provided $0.4 \leq x \leq 0.7$, $0 < y \leq 0.045$, and $0.4 < a < 0.6$). For example, in cases where the three-phase BF-BKT-BM ceramic has a composition ratio of BF:BKT:BM=60:40:3, specifically assuming x=0.6, y=0.03, and a=0.5, the metallic elements contained in the precursor solution have a molar ratio of $Bi:K:Fe:Ti:Mn = 0.83:0.2:0.6:0.4:0.03$.

The precursor solution is prepared in the above molar ratio, and therefore the BF-BKT-BM ceramic, which has a reduced leakage current as compared with a BF-BKT ceramic, is capable of being produced. Details of such a ceramic will be described hereinafter.

In the precursor solution according to the embodiment, K content may be further increased relative to the amount defined by the above molar ratio. The precursor solution to which a larger amount of K is added may be prepared so as to contain the metallic elements having a molar ratio of $Bi:K:Fe:Ti:Mn = x+(1-x) \times a + y : (1-x) \times (1-a) + \alpha : x : 1-x : y$ (provided $0.4 \leq x \leq 0.7$, $0 < y \leq 0.045$, $0.4 < a < 0.6$, and $0 \leq \alpha \leq 0.1$). The symbol α represents a proportion of the additive amount of K, and K is added to the precursor solution according to the embodiment in such an amount for the purpose of relatively increasing the proportion of K in the precursor solution, and it may be in the range of 0≤α≤0.1. Accordingly, the precursor solution can be prepared so as to contain a relatively large amount of K. Although K is volatilized by heat treatment or the like in the manufacturing process with the result that the amount of K that is appropriate for sufficiently crystallizing the BF-BKT-BM ceramic is decreased, such a problem is capable of being prevented by virtue of such a precursor solution. Consequently, the piezoelectric properties of the ceramic to be produced are capable of being improved.

Furthermore, in the precursor solution according to the embodiment, Bi content may be further increased relative to the amount defined by the above molar ratio. The precursor solution to which a larger amount of Bi is added may be prepared so as to contain the metallic elements having a molar ratio of Bi:K:Fe:Ti:Mn=x+(1−x)×a+y+β:(1−x)×(1−a)+α:x:1−x:y (provided 0.4≤x≤0.7, 0<y≤0.045, 0.4<a<0.6, 0≤α≤0.1, and 0≤β≤0.1). The symbol β represents a proportion of the additive amount of Bi, and Bi is added to the precursor solution according to the embodiment in such an amount for the purpose of relatively increasing the proportion of Bi in the precursor solution, and it may be in the range of 0≤β≤0.1. Consequently, the squareness of the P-E hysteresis of the BF-BKT-BM ceramic is capable of being improved.

1-2. Film Formation Process (S2)

Subsequently, in a film formation process (S2), a first film is capable of being formed with the precursor solution produced in the precursor solution preparation process (S1) as illustrated in FIG. 1A. A film formation method used in the film formation process (S2) according to the embodiment is not specifically limited in so far as a film having a predetermined thickness is capable of being formed, and a typical technique for the film formation may be employed. The first film may be formed with the precursor solution according to the embodiment, for example, by a spin coat method.

1-3. Drying and Degreasing Process (S3)

Subsequently, in a drying and degreasing process (S3), the first film produced in the film formation process (S2) is heated to be dried and degreased, thereby being able to produce a second film as illustrated in FIG. 1A. A heating method used in the drying and degreasing process (S3) according to the embodiment is not specifically limited in so far as the first film is capable of being dried under predetermined conditions, and a typical heater may be employed. For example, the first film may be dried at a temperature in the range of 100° C. to 200° C., and then the resultant first film may be degreased in a drying furnace at a temperature in the range of 350° C. to 450° C., thereby producing the second film.

1-4. Lamination (S4)

Subsequently, in a lamination process (S4), the first film may be further formed (S2) on the second film produced in the drying and degreasing process (S3) with the precursor solution according to the embodiment, and such a first film may be dried and degreased to produce a laminate including the second films as illustrated in FIG. 1A. Furthermore, in this process (S4), the film formation process (S2) and the drying and degreasing process (S3) may be repeatedly performed many times until the laminate has a desired film thickness.

1-5. Anneal (S5)

Subsequently, in an annealing process (S5), the laminate that includes a plurality of the second films and has been produced in the lamination process (S4) is annealed, thereby producing the BF-BKT-BM ceramic as illustrated in FIG. 1A. A method for annealing the laminate including the second films is not specifically limited in so far as the laminate is capable of being crystallized. For example, in the annealing process according to the embodiment, a typical electric furnace, infrared furnace, or rapid thermal annealing (RTA) furnace may be used as a heater. Preferably, an RTA furnace may be used as the heater for the laminate. For example, the laminate may be annealed in an RTA furnace in the range of 600° C. to 700° C. to produce the BF-BKT-BM ceramic. The BF-BKT-BM ceramic to be produced may be a ceramic thin film having a predetermined thickness.

Furthermore, in the process for manufacturing the ceramic according to the embodiment, procedures from the film formation to the annealing (S2 to S5) may be repeatedly performed again a predetermined number of times on the BF-BKT-BM ceramic produced through the annealing process (S5) to produce the BF-BKT-BM ceramic having a desired film thickness. By virtue of this process, for example, the BF-BKT-BM ceramic thin film having a thickness of less than or equal to 1 µm is capable of being formed without causing a crack. In addition, by virtue of this process, a BF-BKT-BM ceramic thin film having a high orientation is capable of being produced.

With reference to FIG. 1B, the annealing process (S5) may be performed without preliminarily performing the lamination process (S4), and a lamination process (S6) may be performed after the annealing process (S5), thereby producing the BF-BKT-BM ceramic having a desired thickness. In this case, the precursor solution is prepared (S1), and then the BF-BKT-BM ceramic may be produced through the film formation process (S2), the drying and degreasing process (S3), and the annealing process (S5). Subsequently, the lamination process (S6), in which the film formation process (S2), the drying and degreasing process (S3), and the annealing process (S5) are repeated, may be performed a desired number of times on the resultant BF-BKT-BM ceramic to form the BF-BKT-BM ceramic having a desired film thickness.

For example, the precursor solution and process for manufacturing the ceramic according to the embodiment have the following characteristics.

By virtue of the precursor solution of the ceramic according to the embodiment, the BF-BKT-BM ceramic having a reduced leakage current relative to that of the BF-BKT ceramic is capable of being produced, and precursor solution thereof is also capable of being obtained. Details of this advantage will be described hereinafter.

Furthermore, by virtue of the embodiment, K is capable of being further added to the precursor solution in an excess amount that is greater than or equal to 0 mol % and less than or equal to 10 mol % relative to a stochiometric molar ratio of K. Consequently, the piezoelectric properties of the BF-BKT-BM ceramic to be produced are capable of being improved, and details of this advantage will be described below.

K as a chemical substance has a high vapor pressure and is easily volatilized in the manufacturing process, especially in the annealing. Accordingly, even though a molar ratio of the metallic elements in the precursor solution is adjusted during the manufacturing process in consideration of the chemical composition of the BF-BKT-BM ceramic, K will be volatilized in the manufacturing process. Consequently, the resultant BF-BKT-BM ceramic contains K in an insufficient amount relative to a predetermined amount, resulting in reduced piezoelectric properties.

On the other hand, in the precursor solution according to the embodiment, because K is further added to the precursor solution in an excess amount that is greater than or equal to 0 mol % and less than or equal to 10 mol % relative to a stochiometric molar ratio of K, K added in the excess amount is capable of compensating for the reduction thereof resulting from the volatilization by the annealing. Consequently, the BF-BKT-BM ceramic, which has a reduced leakage current and exhibits improved piezoelectric properties as compared with the BF-BKT ceramic, is capable of being produced.

Furthermore, by virtue of the embodiment, Bi is capable of being further added to the precursor solution in an excess amount that is greater than or equal to 0 mol % and less than or equal to 10 mol % relative to a stochiometric molar ratio of Bi. Consequently, the squareness of the P-E hysteresis of the BF-BKT-BM ceramic is capable of being improved, and details of this advantage will be described below.

Bi as a chemical substance has a high vapor pressure and is easily volatilized in the manufacturing process, especially in the annealing. Accordingly, even though a molar ratio of the metallic elements in the precursor solution is adjusted during the manufacturing process in consideration of the chemical composition of the BF-BKT-BM ceramic, Bi will be volatilized in the manufacturing process. Consequently, the resultant BF-BKT-BM ceramic contains Bi in an insufficient amount relative to a predetermined amount, resulting in reduced squareness of the P-E hysteresis.

On the other hand, in the precursor solution according to the embodiment, because Bi is further added to the precursor solution in an excess amount that is greater than or equal to 0 mol % and less than or equal to 10 mol % relative to a stochiometric molar ratio of Bi, Bi added in the excess amount is capable of compensating for the reduction thereof resulting from the volatilization by the annealing. Consequently, the BF-BKT-BM ceramic, which has a reduced leakage current and exhibits improved squareness of the P-E hysteresis as compared with the BF-BKT ceramic, can be produced.

Owing to the above advantages, the manufacturing process of the BF-BKT-BM ceramic having a reduced leakage current and the precursor solution of the BF-BKT-BM ceramic having a reduced leakage current can be provided.

2. Example

Examples of the ceramic according to the embodiment, the precursor solution thereof, and manufacturing process thereof will be described hereinafter along with comparison examples with reference to accompanying drawings.

2-1. First Example and First Comparison Example

In a first example, the BF-BKT-BM ceramic having a composition ratio of BF:BKT:BM=60:40:3 was produced by the process for manufacturing the ceramic according to the embodiment, and characteristics thereof were evaluated. Specifically, provided x=0.6, y=0.03, and a=0.5, the precursor solution according to the first example contained the metallic elements having a molar ratio of Bi:K:Fe:Ti:Mn=0.83:0.2+α:0.6:0.4:0.03 (provided α=0.04).

In the first comparison example, the ceramic, in which two-phase crystals were mixed, contained only BF and BKT and did not contain BM. A precursor solution according to the comparison example was prepared so as to contain metallic elements having a molar ratio of Bi:Fe:K:Ti=0.8:0.6:0.2+α: 0.4 (provided α=0.04).

Multiple BF-BKT-BM ceramics were produced through the film formation process (S2), the drying and degreasing process (S3), and the annealing process (S5), and then the resultant multiple ceramics were stacked so as to form a laminate having a thickness of 250 nm, thereby producing the BF-BKT-BM ceramic according to the first example (see, FIG. 1B). In the film formation process (S2), the first film was formed with two types of the precursor solution according to the first example and the comparison example by a spin coat method (3500 rpm). In the drying and degreasing process (S3), the first film was dried at a temperature of 150° C. for two minutes and then degreased at a temperature of 400° C. for four minutes, thereby producing the second film. In the annealing process (S5), the second film was annealed in the RTA furnace at a temperature of 650° C. for five minutes.

For the purpose of evaluating characteristics, a metallic layer containing Pt is formed on the BF-BKT-BM ceramic film produced after the annealing process by a direct current sputtering method. After the formation of the metallic layer, the metallic layer was sintered at a temperature of 650° C. for five minutes to form an electrode. With respect to the evaluation of characteristics, P-E hysteresis was measured at room temperature at a frequency of 1 kHz.

The BF-BKT ceramic according to the first comparison example was manufactured by a manufacturing method the same as that in the first example.

2-1-1. P-E Hysteresis

Figure 2A:
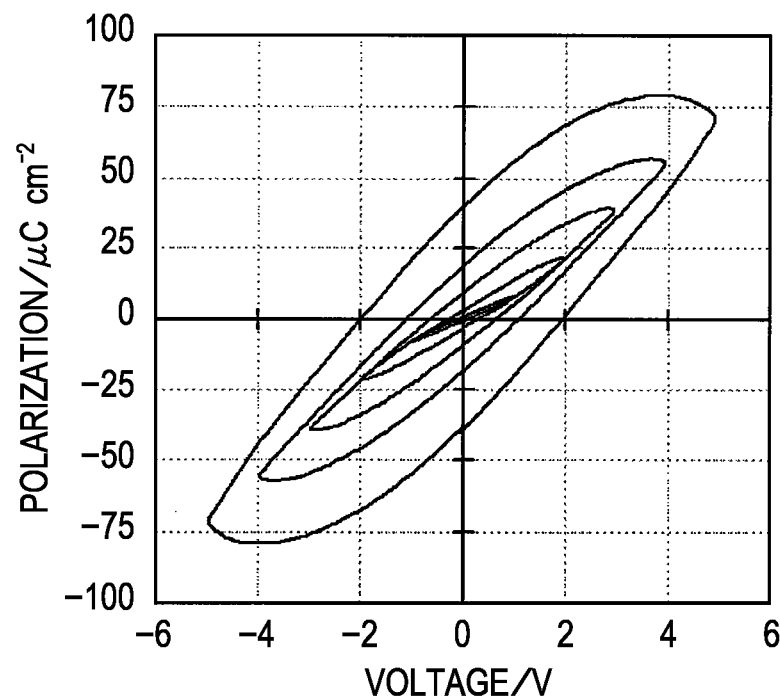
FIG. 2A illustrates P-E hysteresis of ceramic according to a first comparable example.
Figure 2B:
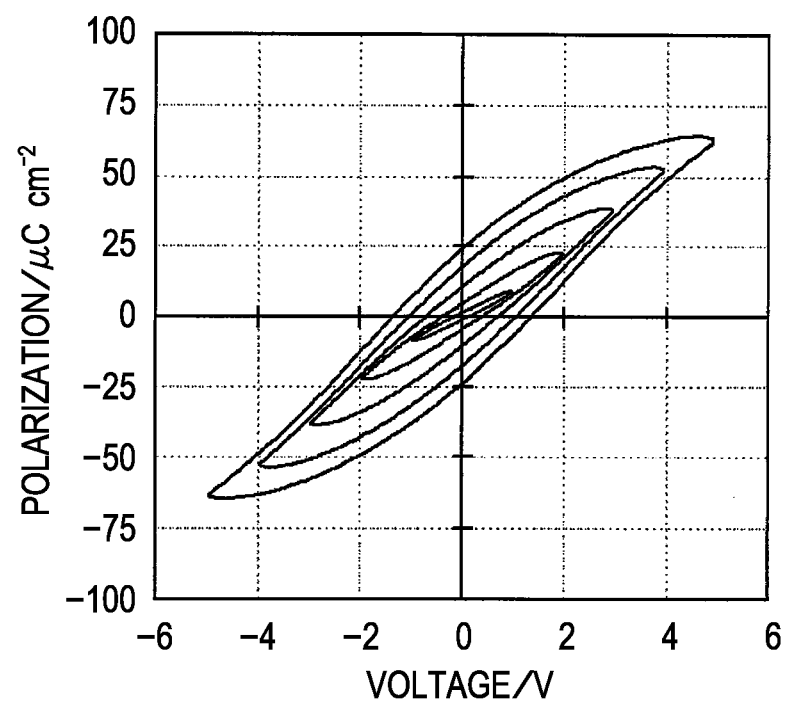
FIG. 2B illustrates P-E hysteresis of ceramic according to a first example.

FIG. 2A illustrates the P-E hysteresis of the BF-BKT ceramic according to the first comparison example. FIG. 2B illustrates the P-E hysteresis of the BF-BKT-BM ceramic according to the first example.

With reference to FIG. 2A, in the BF-BKT ceramic of the first comparison example, the peak value of polarization occurs at an electric field intensity that is lower than the maximum electric field intensity, and therefore a large leakage current is confirmable. On the other hand, with reference to FIG. 2B, in the BF-BKT-BM ceramic of the first example, the peak value of polarization appears in the vicinity of the maximum electric field intensity, and therefore a reduced leakage current relative to the first comparison example is confirmable. Consequently, it is confirmed that the BF-BKT-BM ceramic has a reduced leakage current as compared with the BF-BKT ceramic.

2-2. Second Example

In a second example, Bi was further added to the precursor solution according to the first example, and the precursor solution was prepared so as to contain a relatively large amount of Bi with respect to the other metallic elements. Specifically, provided x=0.6, y=0.03, and α=0.04, the precursor solution according to the second example contained the metallic elements having a molar ratio of Bi:Fe:K:Ti:Mn=0.83+β:0.24:0.6:0.03 (provided 0≤β≤0.08).

Multiple BF-BKT-BM ceramics were produced through the film formation process (S2), the drying and degreasing process (S3), and the annealing process (S5), and then the resultant multiple ceramics were stacked so as to form a laminate having a thickness of 600 nm to produce the BF-BKT-BM ceramic according to the second example (see, FIG. 1B). In the film formation process (S2), the first film was formed with the precursor solution according to the second example by a spin coat method (1500 rpm). In the drying and degreasing process (S3), the first film was dried at a temperature of 150° C. for two minutes and then degreased at a temperature of 400° C. for four minutes, thereby producing the second film. In the annealing process (S5), the second film was annealed in the RTA furnace at a temperature of 650° C. for five minutes.

For the purpose of evaluating characteristics, a metallic layer containing Pt is formed on the BF-BKT-BM ceramic film produced after the annealing process by a direct current sputtering method. After the formation of the metallic layer, the metallic layer was sintered at a temperature of 650° C. for five minutes to form an electrode. With respect to the evaluation of characteristics, P-E hysteresis was measured at room temperature at a frequency of 1 kHz.

2-2-1. P-E Hysteresis

Figure 3A:
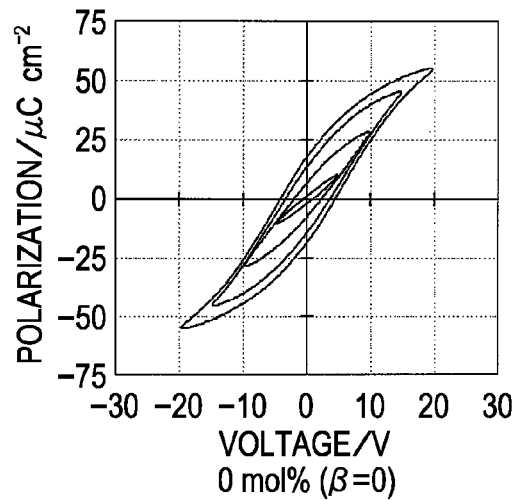
FIG. 3A illustrates P-E hysteresis of ceramic according to a second example.
Figure 3B:
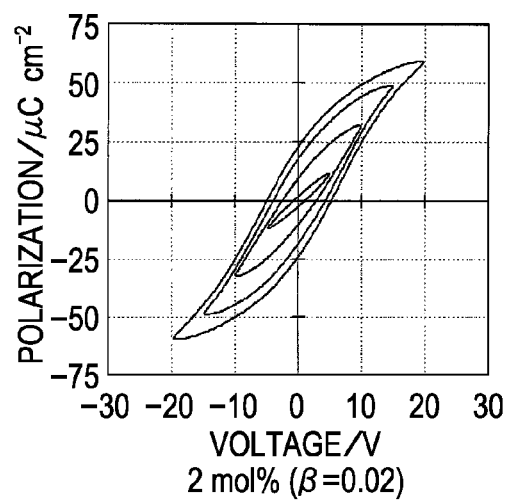
FIG. 3B illustrates P-E hysteresis of another ceramic according to the second example.
Figure 3C:
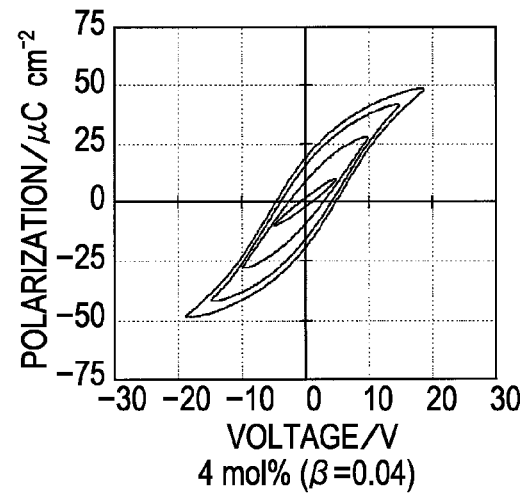
FIG. 3C illustrates P-E hysteresis of another ceramic according to the second example.
Figure 3D:
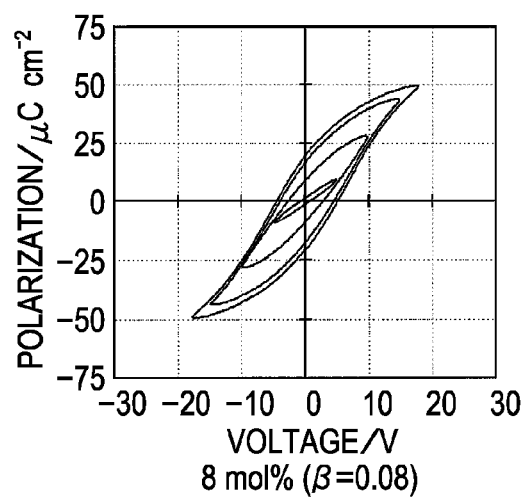
FIG. 3D illustrates P-E hysteresis of another ceramic according to the second example.

FIGS. 3B to 3D each illustrate the P-E hysteresis according to the second example (in the case of $\beta$=0.02, 0.04, and 0.08), and FIG. 3A illustrates the P-E hysteresis according to the first example (in the case of $\beta$=0). With reference to FIGS. 3A to 3D, it is confirmed that, in cases where Bi was excessively added in an amount of 2 mol % ($\beta$=0.02), the squareness of hysteresis is improved relative to the P-E hysteresis according to the first example. Furthermore, in cases where Bi was excessively added in an amount of 4 mol % ($\beta$=0.04) and in cases where Bi was excessively added in an amount of 8 mol % ($\beta$=0.08), it is confirmed that addition of a larger amount of Bi leads to the improved squareness of the P-E hysteresis. By virtue of this example, it was confirmed that the precursor solution could contain the metallic elements having a molar ratio of Bi:K:Fe:Ti:Mn=x+(1−x)×a+y+$\beta$:1−a+$\alpha$:x:1−x:y (provided 0.4≤x≤0.7, 0<y≤0.045, 0.4<a<0.6, 0≤$\alpha$≤0.1, and 0≤$\beta$≤0.1) and that $\beta$ representing the amount of Bi to be excessively added may be in the range of 0≤$\beta$≤0.1.

2-3. Third Example

In a third example, the precursor solution was prepared so as to contain a smaller amount of BM relative to the precursor solution according to the second example. Specifically, provided x=0.6 and y=0.02, the precursor solution according to the third example contained the metallic elements having a molar ratio of Bi:Fe:K:Ti:Mn=0.82+$\beta$:0.2+$\alpha$:0.6:0.02 (provided $\alpha$=0.04 and ($\beta$=0.02).

Multiple BF-BKT-BM ceramics were produced through the film formation process (S2), the drying and degreasing process (S3), and the annealing process (S5), and then the resultant multiple ceramics were stacked so as to form a laminate having a thickness of 600 nm, thereby producing the BF-BKT-BM ceramic according to the third example (see, FIG. 1B). In the film formation process (S2), the first film was formed with the precursor solution according to the third example by a spin coat method (1500 rpm). In the drying and degreasing process (S3), the first film was dried at a temperature of 150° C. for two minutes and then degreased at a temperature of 400° C. for four minutes, thereby producing the second film. In the annealing process (S5), the second film was annealed in the RTA furnace at a temperature of 650° C. for five minutes.

For the purpose of evaluating characteristics, a metallic layer containing Pt is formed on the BF-BKT-BM ceramic film produced after the annealing process by a direct current sputtering method. After the formation of the metallic layer, the metallic layer was sintered at a temperature of 650° C. for five minutes to form an electrode. With respect to the evaluation of characteristics, P-E hysteresis was measured at room temperature at a frequency of 1 kHz.

2-3-1. P-E Hysteresis

Figure 4:
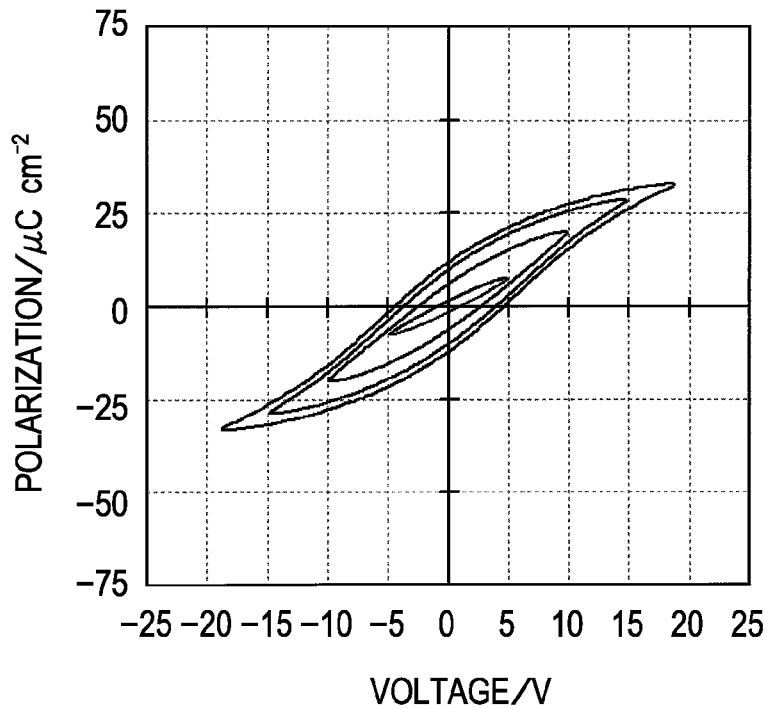
FIG. 4 illustrates P-E hysteresis of ceramic according to a third example.

FIG. 4 illustrates the P-E hysteresis according to the third example. With reference to FIG. 4, although values of $P_m$ are small, the P-E hysteresis similar to that in the second example is observed also in the third embodiment. By virtue of this example, it was confirmed that a condition of at least y≥0.02 was efficient.

2-4. Fourth Example

In a fourth example, precursor solution was prepared so as to contain a larger amount of BM relative to the precursor solution according to the second example. Specifically, provided x=0.6 and y=0.045, the precursor solution according to the fourth example contained the metallic elements having a molar ratio of Bi:K:Fe:Ti:Mn=0.845+$\beta$:0.2+$\alpha$:0.6:0.4:0.045 (provided $\alpha$=0.04 and $\beta$=0.04).

Multiple BF-BKT-BM ceramics were produced through the film formation process (S2), the drying and degreasing process (S3), and the annealing process (S5), and then the resultant multiple ceramics were stacked so as to form a laminate having a thickness of 800 nm, thereby producing the BF-BKT-BM ceramic according to the fourth example (see, FIG. 1B). In the film formation process (S2), the first film was formed with precursor solution according to the fourth example by a spin coat method (1500 rpm). In the drying and degreasing process (S3), the first film was dried at a temperature of 150° C. for two minutes and then degreased at a temperature of 400° C. for four minutes, thereby producing the second film. In the annealing process (S5), the second film was annealed in the RTA furnace at a temperature of 650° C. for five minutes.

For the purpose of evaluating characteristics, a metallic layer containing Pt is formed on the BF-BKT-BM ceramic film produced after the annealing process by a direct current sputtering method. After the formation of the metallic layer, the metallic layer was sintered at a temperature of 650° C. for five minutes to form an electrode. With respect to the evaluation of characteristics, P-E hysteresis was measured at room temperature at a frequency of 1 kHz.

2-4-1. P-E Hysteresis

Figure 5:
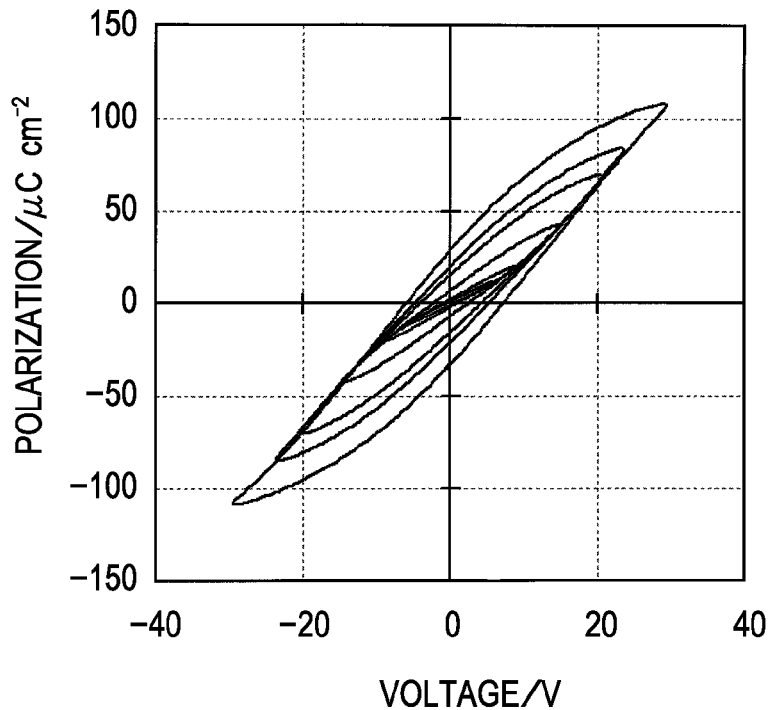
FIG. 5 illustrates P-E hysteresis of ceramic according to a fourth example.

FIG. 5 illustrates the P-E hysteresis according to the fourth example. With reference to FIG. 5, although values of $P_m$ are large, the P-E hysteresis similar to that in the second example is observed also in the fourth embodiment. By virtue of this example, it was confirmed that a condition of at least y≤0.045 was efficient.

2-5. Fifth Example

In a fifth example, BF-BKT-BM ceramic made from precursor solution to which Bi and K were not excessively added was manufactured by the process for manufacturing the ceramic according to the embodiment so as to have the following composition ratios: (1) BF:BKT:BM=60:40:1.8; and (2) BF:BKT:BM=50:50:1.5, and then characteristics thereof were evaluated.

Specifically, in the case of the (1), provided x=0.6 and y=0.018, the precursor solution according to the fifth example contained metallic elements having a molar ratio of Bi:K:Fe:Ti:Mn=0.818:0.2:0.6:0.4:0.018. In the case of the (2), provided x=0.6 and y=0.018, the precursor solution according to the fifth example contained metallic elements having a molar ratio of Bi:K:Fe:Ti:Mn=0.768:0.25:0.5:0.5:0.015.

Multiple BF-BKT-BM ceramics were produced through the film formation process (S2), the drying and degreasing process (S3), and the annealing process (S5), and then the resultant multiple ceramics were stacked so as to form a laminate having a thickness of 740 nm, thereby producing the BF-BKT-BM ceramic according to the fifth example (see, FIG. 1B). In the film formation process (S2), the first film was formed with the precursor solution according to the fifth example by a spin coat method (1500 rpm). In the drying and degreasing process (S3), the first film was dried and degreased at a temperature of 400° C. for four minutes, thereby producing the second film. In the annealing process (S5), the second film was annealed in the RTA furnace at a temperature of 650° C. for five minutes.

For the purpose of evaluating characteristics, a metallic layer containing Pt is formed by a direct current sputtering method on the BF-BKT-BM ceramic film produced after the annealing process. After the formation of the metallic layer, the metallic layer was sintered at a temperature of 650° C. for five minutes to form an electrode. With respect to the evaluation of characteristics, P-E hysteresis was measured at room temperature at a frequency of 1 kHz.

Figure 6A:
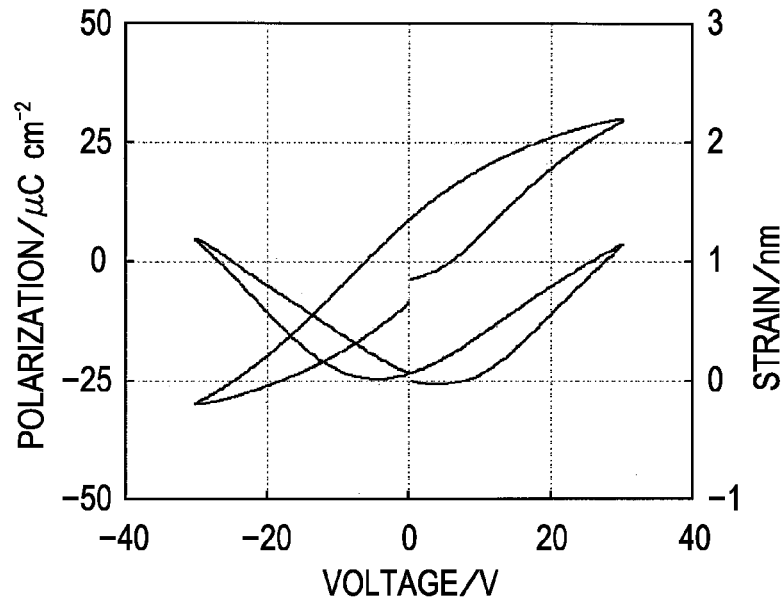
FIG. 6A illustrates P-E hysteresis and relationships between electric-field-induced strain and electric field characteristics of ceramic according to a fifth example.
Figure 6B:
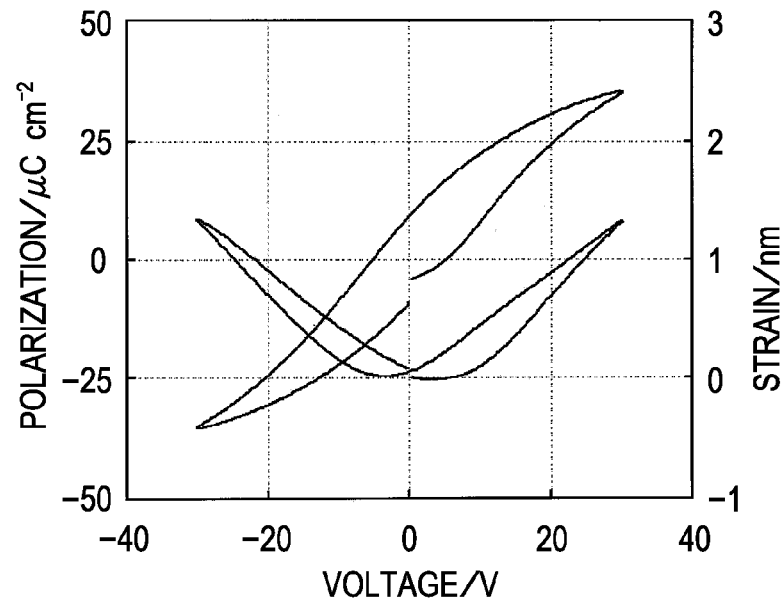
FIG. 6B illustrates P-E hysteresis and relationships between the electric-field-induced strain and the electric field characteristics of another ceramic according to the fifth example.
Figure 7A:
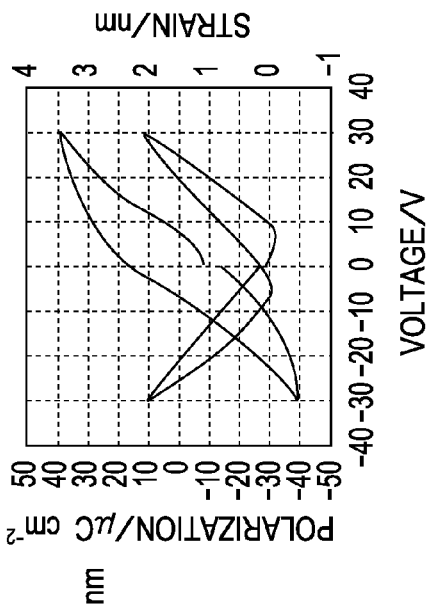
FIG. 7A illustrates P-E hysteresis and relationships between electric-field-induced strain and electric field characteristics of ceramic according to a sixth example.
Figure 7B:
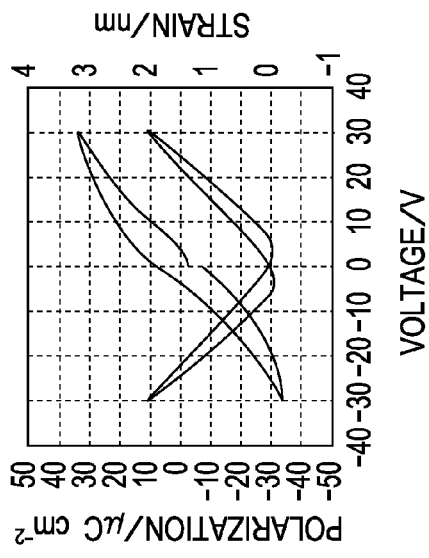
FIG. 7B illustrates P-E hysteresis and relationships between the electric-field-induced strain and the electric field characteristics of another ceramic according to the sixth example.
Figure 7C:
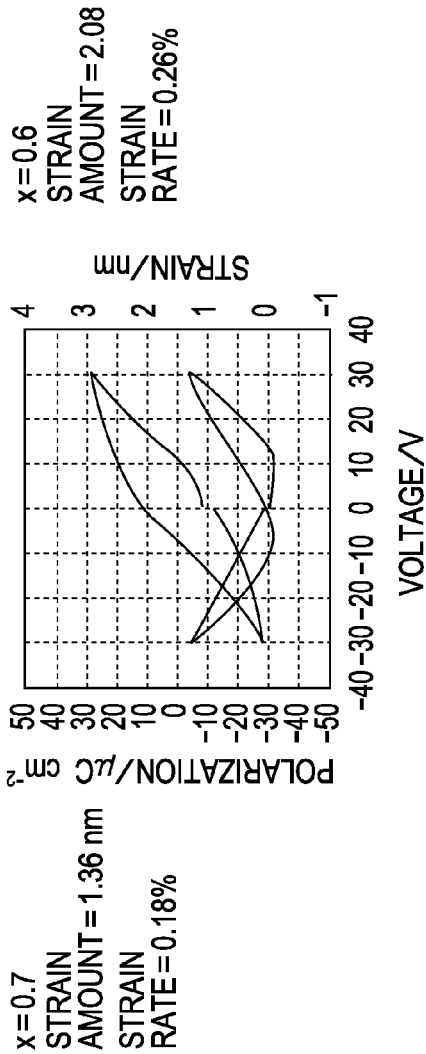
FIG. 7C illustrates P-E hysteresis and relationships between the electric-field-induced strain and the electric field characteristics of another ceramic according to the sixth example.
Figure 7D:
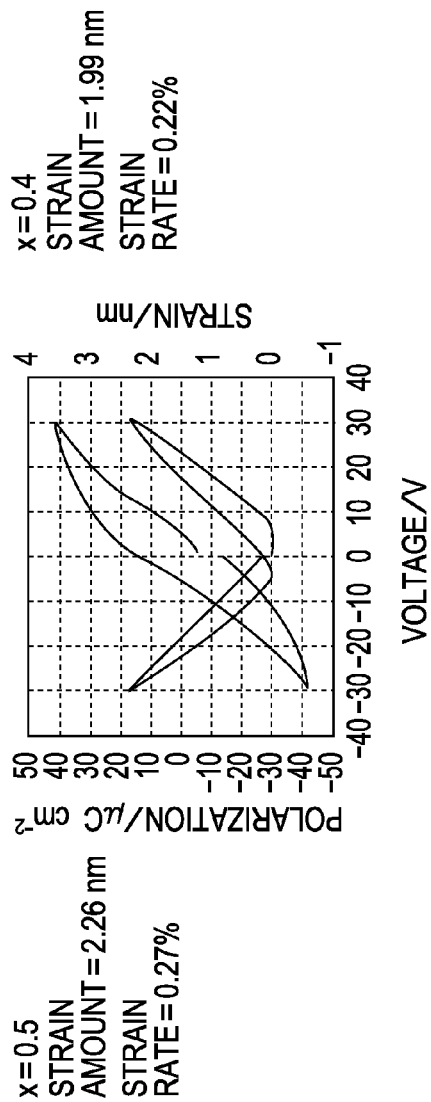
FIG. 7D illustrates P-E hysteresis and relationships between the electric-field-induced strain and the electric field characteristics of another ceramic according to the sixth example.

2-5-1. P-E Hysteresis/Electric-Field-Induced Strain and Electric Field Characteristics FIGS. 6A and 6B each illustrate the P-E hysteresis and relationships between electric-field-induced strain and electric field characteristics of the ceramic according to the fifth example (in the case of x=0.6 or 0.5). In each of FIGS. 6A and 6B, a left longitudinal axis indicates degrees of polarization, and a right longitudinal axis indicates degrees of strain. With reference to FIGS. 6A and 6B, it is confirmed that each case exhibits good piezoelectric properties. Especially, in the case of x=0.5, a good strain rate of 0.18% is obtained. By virtue of this example, provided α=0 and β=0, it was confirmed that ceramic exhibiting a strain rate of at least 0.18% was capable of being manufactured. In addition, provided y≥0.015, it was confirmed that good characteristics were exhibited.

2-6. Sixth Example

In a sixth example, BF-BKT-BM ceramic was manufactured by the process for manufacturing the ceramic according to the embodiment so as to have the following composition ratios: (1) BF:BKT:BM=70:30:3.5; (2) BF:BKT:BM=60:40:3; (3) BF:BKT:BM=50:50:2.5; and (4) BF:BKT:BM=40:60:2, and then characteristics thereof were evaluated.

Specifically, in the case of the (1), provided x=0.7, y=0.035, and a=0.5, the precursor solution according to the sixth example contained the metallic elements having a molar ratio of Bi:K:Fe:Ti:Mn=0.885+β:0.15+α:0.7:0.3:0.035 (provided α=0.03 and β=0.04). In the case of the (2), provided x=0.6, the precursor solution according to the sixth example contained the metallic elements having a molar ratio of Bi:K:Fe:Ti:Mn=0.83+β:0.2+α:0.6:0.4:0.03 (provided α=0.04 and β=0.04). In the case of the (3), provided x=0.5, the precursor solution according to the sixth example contained the metallic elements having a molar ratio of Bi:K:Fe:Ti:Mn=0.775+β:0.25+α:0.5:0.5:0.025 (provided α=0.05 and β=0.04). In the case of the (4), provided x=0.4, the precursor solution according to the sixth example contained the metallic elements having a molar ratio of Bi:K:Fe:Ti:Mn=0.72+β:0.3+α:0.4:0.6:0.02 (provided α=0.06 and β=0.04).

Multiple BF-BKT-BM ceramics were produced through the film formation process (S2), the drying and degreasing process (S3), and the annealing process (S5), and then the resultant multiple ceramics were stacked so as to form a laminate having a thickness of 800 nm, thereby producing the BF-BKT-BM ceramic according to the sixth example (see, FIG. 1B). In the film formation process (S2), the first film was formed with the precursor solution according to the sixth example by a spin coat method (1500 rpm). In the drying and degreasing process (S3), the first film was dried and degreased at a temperature of 400° C. for four minutes, thereby producing the second film. In the annealing process (S5), the second film was annealed in the RTA furnace at a temperature of 650° C. for five minutes.

For the purpose of evaluating characteristics, a metallic layer containing Pt is formed by a direct current sputtering method on the BF-BKT-BM ceramic film produced after the annealing process. After the formation of the metallic layer, the metallic layer was sintered at a temperature of 650° C. for five minutes to form an electrode. With respect to the evaluation of characteristics, P-E hysteresis was measured at room temperature at a frequency of 1 kHz.

2-6-1. P-E Hysteresis/Electric-Field-Induced Strain and Electric Field Characteristics FIGS. 7A to 7D each illustrate the P-E hysteresis and relationships between electric-field-induced strain and electric field characteristics of the ceramic according to the sixth example (in the case of x=0.7, 0.6, 0.5, or 0.4). In each of FIGS. 7A to 7D, a left longitudinal axis indicates degrees of polarization, and a right longitudinal axis indicates degrees of strain. With reference to FIGS. 7A to 7D, it is confirmed that each case exhibits good piezoelectric properties. Especially, in the case of x=0.5, a large strain rate of 0.27% was obtained. By virtue of this evaluation, it was confirmed that the precursor solution could contain metallic elements having a molar ratio of Bi:K:Fe:Ti:Mn=0.5×(x+1)+y+0.04:0.5×(1−x)+α:x:1−x:y (provided 0.4≤x≤0.7 and 0.03≤α≤0.06) and that values of x may be in the range of 0.4≤x≤0.7. In addition, it was confirmed that the strain rate was improved as compared with the fifth example and that addition of Bi and K was capable of improving the piezoelectric properties.

As described above, by virtue of the precursor solution of the ceramic and the process for manufacturing the ceramic according to an aspect of the invention, a leakage current of the BF-BKT ceramic is capable of being reduced, and therefore the squareness of the P-E hysteresis is capable of being improved.

3. Droplet Ejecting Head

Figure 8:
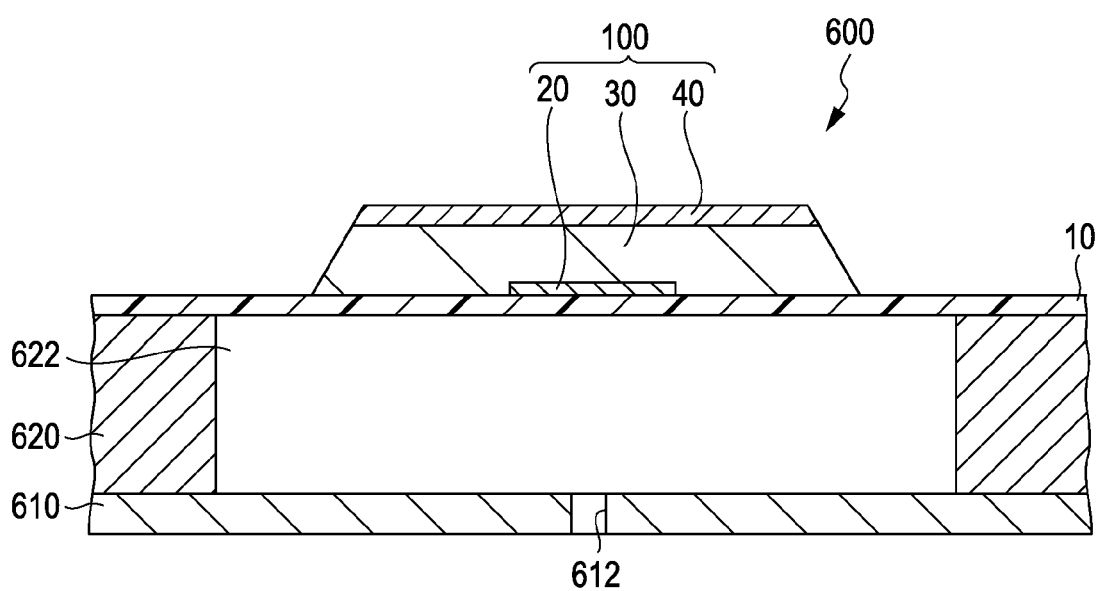
FIG. 8 is a cross-sectional view schematically illustrates part of a droplet ejecting head according to the embodiment of the invention.
Figure 9:
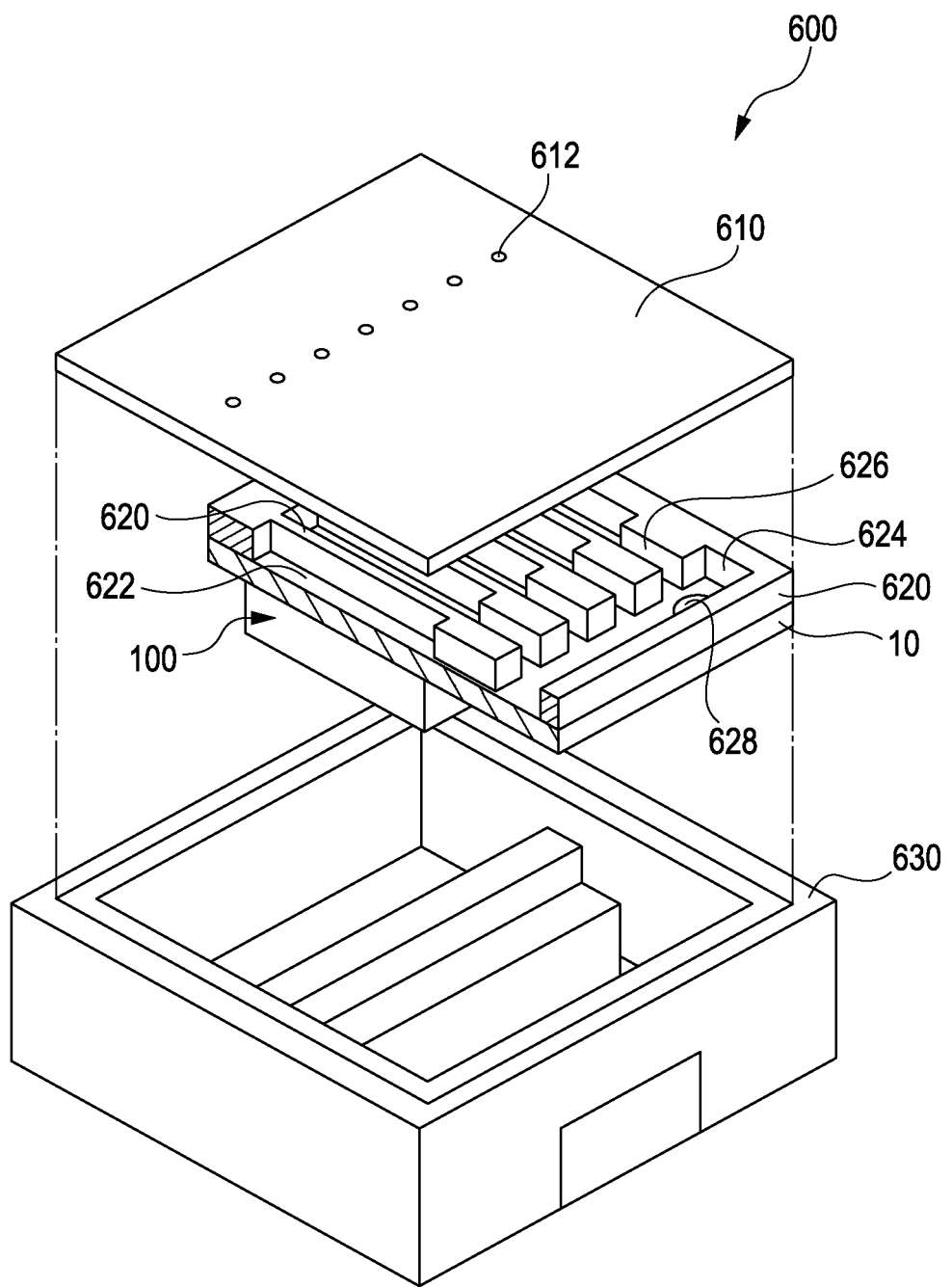
FIG. 9 is an exploded perspective view illustrating the droplet ejecting head according to the embodiment of the invention.

The process for manufacturing the ceramic according to the embodiment is capable of being applied to a process for manufacturing a piezoelectric layer of a piezoelectric device used in a droplet ejecting apparatus. Namely, a droplet ejecting head according to the embodiment includes a piezoelectric device having a piezoelectric layer made from the ceramic according to the embodiment. A droplet ejecting head 600 according to the embodiment will be described hereinafter with reference to the accompanying drawings, the droplet ejecting head 600 being provided with a piezoelectric device 100 including the piezoelectric layer produced by the process for manufacturing the ceramic according to the embodiment. FIG. 8 is a cross-sectional view schematically illustrates part of the droplet ejecting head 600 according to the embodiment. FIG. 9 is an exploded perspective view illustrating the droplet ejecting head 600 according to the embodiment, and the ejecting head 600 is illustrated upside down relative to a normal use situation.

With reference to FIGS. 8 and 9, the droplet ejecting head 600 includes a nozzle plate 610 having a nozzle hole 612, a pressure chamber substrate 620 that serves to form a pressure chamber 622, a vibrating plate 10 that forms one surface of the pressure chamber 622, and the piezoelectric device 100 formed on the vibrating plate 10.

The vibrating plate 10 is produced in the form of plates, and the piezoelectric device 100 is disposed thereon as illustrated in FIG. 8. In other words, the deformation of the piezoelectric device 100, which will be described hereinafter, enables the vibrating plate 10 to be deformed, and therefore volume of the pressure chamber 622 that is formed under the vibrating plate 10 with the pressure chamber substrate 620 is capable of being varied. The configuration and material of the vibrating plate 10 is not specifically limited in so far as the vibrating plate 10 has flexibility and is capable of being deformed. For example, a laminate including a plurality of films may form the vibrating plate 10. In this case, for example, the vibrating plate 10 may be a laminate including an elastic film made from an oxide material such as a silicon oxide or a polymeric material such as polymide and including an insulating film made from an oxide material such as a zirconium oxide.

The piezoelectric device 100 is formed on the vibrating plate 10 as illustrated in FIG. 8. The piezoelectric device 100 may include a first electrode 20, a second electrode 40, and a piezoelectric layer 30 interposed therebetween. For example, piezoelectric layer 30 may be able to be deformed by applying a predetermined voltage to the piezoelectric layer 30 through the first electrode 20 and the second electrode 40. Specifically, as illustrated in FIG. 8, the piezoelectric device 100 may include the first electrode 20 disposed on the vibrating plate 10, the piezoelectric layer 30 that is formed so as to cover at least part of the first electrode 20, and the second electrode 40 that is formed so as to cover at least part of the piezoelectric layer 30 and so as to overlap the first electrode 20. For example, the piezoelectric device 100 may be a unimorph type piezoelectric device having a bending vibration mode (bent mode).

Although an example of the piezoelectric device 100 will be described hereinafter on the basis of being the unimorph type piezoelectric device having the bending vibration mode (bent mode), the piezoelectric device 100 is not limited to the following configuration.

The first electrode 20 is disposed on the vibrating plate 10 as illustrated in FIG. 8. The first electrode 20 includes electrically conductive layers and, for example, may form a lower electrode in the piezoelectric device 100. The piezoelectric layer 30 is formed so as to cover at least part of the first electrode 20 as illustrated in FIG. 8. The shape of the piezoelectric layer 30 may not be limited in so far as the piezoelectric layer 30 is capable of covering at least part of the first electrode 20 above the pressure chamber 622. The piezoelectric layer 30 is formed by the process for manufacturing the ceramic according to the embodiment. As illustrated in FIG. 8, the second electrode 40 is formed so as to overlap at least part of the first electrode 20 and the piezoelectric layer 30 above the pressure chamber 622. The second electrode 40 includes electrically conductive layers and, for example, may form an upper electrode in the piezoelectric device 100.

The structures and materials of the first electrode 20 and the second electrode 40 are not especially limited in so far as the electrodes are electrically conductive. For example, each of the first electrode 20 and the second electrode 40 may have a single layer structure. Alternatively, each of the first electrode 20 and the second electrode 40 may have a laminate structure including a plurality of films. For example, each of the first electrode 20 and the second electrode 40 may be an electrically conductive layer containing any one of metal such as platinum (Pt), iridium (Ir), gold (Au), nickel (Ni), and titanium (Ti) and an electrically conductive oxide such as a strontium oxide (SRO) and lanthanum nickelate (LNO).

The first electrode 20 and the second electrode 40 are electrically connected to a driving circuit [integrated circuit (IC)] (not illustrated).

The piezoelectric layer 30 is polycrystal having piezoelectric properties and is the BF-BKT-BM ceramic according to the embodiment. Accordingly, because the detail of the piezoelectric layer (the BF-BKT-BM ceramic) 30 is described above, it is omitted here.

The number of the piezoelectric device 100 is not specifically limited, and a plurality of the piezoelectric devices 100 may be formed. In cases where the plurality of the piezoelectric devices 100 are formed, the first electrode 20 may be a common electrode, or the second electrode 40 may be the common electrode.

Furthermore, the droplet ejecting head 600 may have a housing 630 as illustrated in FIG. 9. FIG. 9 illustrates simplified piezoelectric device 100. With reference to FIG. 9, the housing 630 is capable of accommodating the nozzle plate 610, the pressure chamber substrate 620, and the piezoelectric device 100. Examples of a material of the housing 630 include a resin and metal.

With reference to FIGS. 8 and 9, the nozzle plate 610 has the nozzle hole 612. The nozzle hole 612 is capable of ejecting droplets of liquid such as ink (not only liquid but also including various functional materials that are prepared with a solvent or dispersion medium so as to have appropriate viscosity or including a substance containing metal flakes or the like, and the same is applied hereafter). For example, a plurality of the nozzle holes 612 are formed on the nozzle plate 610 in line. Examples of a material of the nozzle plate 610 include silicon and steel used stainless (SUS).

The pressure chamber substrate 620 is disposed on the nozzle plate 610 (under the nozzle plate 610, in FIG. 9). An Example of a material of the pressure chamber substrate 620 includes silicon. The pressure chamber substrate 620 defines a space between the nozzle plate 610 and the vibrating plate 10, and therefore the droplet ejecting head 600 is provided with a reservoir (liquid reserving section) 624, a feed opening 626 connected to the reservoir 624, and the pressure chamber 622 connected to the feed opening 626. The reservoir 624, the feed opening 626, and the pressure chamber 622 are flow channels of the liquid. Although the flow channels were individually described in this embodiment, they may be designed in any manner. In addition, for example, although part of the flow channels is narrowed to form the feed opening 626 in the illustration, such a configuration is not indispensable. The feed opening 626 may be formed on the basis of an appropriate design. The reservoir 624, the feed opening 626, and the pressure chamber 622 are defined by the nozzle plate 610, the pressure chamber substrate 620, and the vibrating plate 10. The reservoir 624 is capable of temporarily reserving ink supplied from the outside (an ink cartridge, for example) through a thorough-hole 628 formed on the vibrating plate 10. The ink inside the reservoir 624 is capable of being supplied to the pressure chamber 622 through the feed opening 626. The vibrating plate 10 is deformed, and therefore volume of the pressure chamber 622 is changed. The pressure chamber 622 is connected to the nozzle hole 612. The volume change in the pressure chamber 622 leads to ejection of the liquid from the nozzle hole 612.

The piezoelectric device 100 is disposed on the pressure chamber substrate 620 (under the pressure chamber substrate 620, in FIG. 9). The piezoelectric device 100 is capable of being electrically connected to a driving circuit (not illustrated) for the piezoelectric device to be worked (vibrated and deformed) on the basis of a signal transmitted from the driving circuit. The vibrating plate 10 is deformed depending on the action of the laminate structure (piezoelectric layer 30) and therefore is capable of appropriately changing inner pressure of the pressure chamber 622.

The droplet ejecting head 600 according to the embodiment is provided with the piezoelectric device 100 including the piezoelectric layer formed with the ceramic according to the embodiment. Accordingly, the droplet ejecting head 600 which is provided with the piezoelectric device 100 having the piezoelectric layer including the BF-BKT-BM ceramic is capable of being provided, the BF-BKT-BM ceramic having a reduced leakage current and exhibiting improved squareness of P-E hysteresis relative to BF-BKT ceramic.

In this embodiment, the droplet ejecting head 600 as an ink jet recording head has been described. However, the droplet ejecting head according to an aspect of the invention may be applied to, for example, a color material ejecting head used for manufacturing a color filter of a liquid crystal display or the like, an electrode material ejecting head used for forming an electrode of an organic electro-luminescence (EL) display and a field emission display (FED), a living-organic material ejecting head used for manufacturing a biochip.

4. Droplet Ejecting Apparatus

Figure 10:
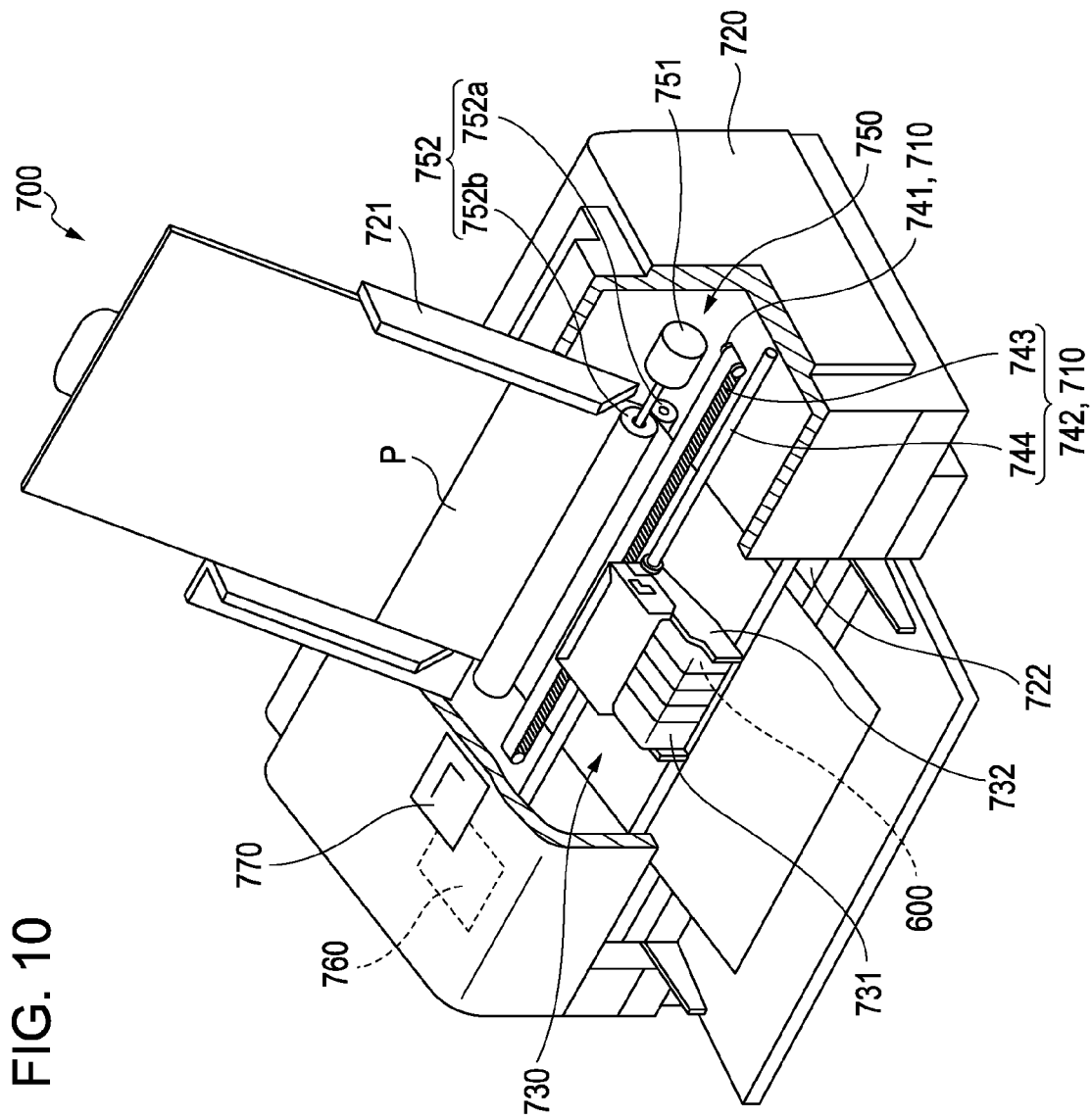
FIG. 10 is a perspective view schematically illustrating a droplet ejecting apparatus according to the embodiment of the invention.

A droplet ejecting apparatus, which has a droplet ejecting head including the piezoelectric device 100 produced by the process for manufacturing the ceramic according to the embodiment, will be described with reference to the accompanying drawings. The droplet ejecting apparatus as an ink jet printer having the above droplet ejecting head will be described hereinafter. FIG. 10 is a perspective view schematically illustrating a droplet ejecting apparatus 700 according to the embodiment.

With reference to FIG. 10, the droplet ejecting apparatus 700 includes a head unit 730, a driving section 710, and a control section 760. Furthermore, the droplet ejecting apparatus 700 is capable of including an apparatus body 720, a paper feed section 750, a paper feed tray 721 on which recording paper P is placed, an ejection opening 722 through which the recording paper P is ejected, and an operation panel 770 disposed on an upper surface of the apparatus body 720.

The head unit 730 has an ink jet recording head (hereinafter referred to as "head", simply) including the droplet ejecting head 600. Furthermore, the head unit 730 has an ink cartridge 731 which supplies ink to the head and has a transporting unit (carriage) 732 on which the head and the ink cartridge 731 are mounted.

The driving section 710 enables the head unit 730 to be reciprocated. The driving section 710 has a carriage motor 741 that is a driving source of the head unit 730 and has a reciprocating mechanism 742 that reciprocates the head unit 730 by receiving the rotation of the carriage motor 741.

The reciprocating mechanism 742 includes a carriage guide shaft 744 of which two ends are supported by a frame (not illustrated) and includes a timing belt 743 extending in parallel with the carriage guide shaft 744. The carriage 732 is supported by the carriage guide shaft 744 so as to be able to be reciprocated. Furthermore, the carriage 732 is fixed to part of the timing belt 743. The carriage motor 741 is operated to work the timing belt 743, and therefore the head unit 730 is reciprocated while being guided by the carriage guide shaft 744. During the reciprocation, ink is appropriately ejected from the head to perform printing to the recording paper P.

In the embodiment, although printing is performed while the droplet ejecting head 600 and the recording paper P are moved, the droplet ejecting apparatus according to an aspect of the invention may have a configuration in which printing is performed to the recording paper P while the droplet ejecting head 600 and the recording paper P relatively change positions each other. Furthermore, in the embodiment, although printing is performed to the recording paper P, a recording medium to which printing is capable of being performed by the droplet ejecting apparatus according to an aspect of the invention is not limited to paper. Examples of such a medium variously include cloth, a film, and metal, and the configuration of the apparatus may be appropriately changed.

The control section 760 is capable of controlling the head unit 730, the driving section 710, and the paper feed section 750.

The paper feed section 750 is capable of transporting the recording paper P from the paper feed tray 721 toward the head unit 730. The paper feed section 750 includes a paper feed motor 751 that is a driving source thereof and includes a paper feed roller 752 that rotates by the operation of the paper feed motor 751. The paper feed roller 752 includes a driven roller 752a and a driving roller 752b, and the driving roller 752b is disposed above the driven roller 752a so as to face each other while a transport path of the recording paper P is interposed therebetween. The driving roller 752b is connected to the paper feed motor 751. The control section 760 drives the paper feed section 750, and then the recording paper P is transported so as to pass below the head unit 730.

The head unit 730, the driving section 710, the control section 760, and the paper feed section 750 are provided inside the apparatus body 720.

The droplet ejecting apparatus 700 includes the droplet ejecting head. Accordingly, the droplet ejecting apparatus which is provided with the droplet ejecting head having the piezoelectric device 100 including the piezoelectric layer made from the BF-BKT-BM ceramic is capable of being provided, the BF-BKT-BM ceramic having a reduced leakage current and exhibiting the improved squareness of P-E hysteresis relative to BF-BKT ceramic.

The above exemplified droplet ejecting apparatus has a single droplet ejecting head, and printing is capable of being performed to a recording medium by the droplet ejecting head, but the apparatus may include a plurality of the droplet ejecting heads. In cases where the droplet ejecting apparatus includes the plurality of the droplet ejecting heads, the droplet ejecting heads may be individually operated in the above manner, or the droplet ejecting heads may be connected to each other to form an integrated head. An Example of such an integrated head include a line-type head in which each nozzle hole of the heads is overall positioned so as to be spaced at a uniform distance.

Although the ink jet recording apparatus 700 as an ink jet printer has been described as an example of the droplet ejecting apparatus according to an aspect of the invention, the droplet ejecting apparatus according to an aspect of the invention may be also applied to industrial use. In this case, various functional materials that are prepared with a solvent or a dispersion medium so as to have appropriate viscosity may be used as liquid or the like (liquid material) to be ejected. The droplet ejecting apparatus according to an aspect of the invention is capable of being preferably applied not only to the exemplified image recording apparatus, such as a printer, but also to a color material ejecting apparatus used for manufacturing a color filter of a liquid crystal display or the like, a liquid material ejecting apparatus used for forming an electrode and a color filter of an organic EL display, a FED, and an electrophoretic display, and a living-organic material ejecting apparatus used for manufacturing a biochip.

The above embodiments and various modifications are merely examples, and the invention is not limited to the above. For example, a plurality of the embodiments and modifications are capable of being appropriately combined.

Although the embodiments of the invention have been described above in detail, those skilled in the art will easily understand that the embodiments are capable of being modified without substantially departing from the novelty and advantages of the invention. Accordingly, such modifications are all included in the scope of the invention.

The invention claimed is:

1. A ceramic consisting of a solid solution containing bismuth ferrate, bismuth potassium titanate, and bismuth manganate.

2. The ceramic according to claim 1, wherein the solid solution has a composition of $x(BiFeO_3)$-$(1-x)[(Bi_aK_{1-a})TiO_3]$-$y(BiMnO_3)$ (provided $0.4 \leq x \leq 0.7$, $0 < y \leq 0.045$, and $0.4 < a < 0.6$).

3. A piezoelectric device comprising:
a piezoelectric layer including the ceramic according to claim 1; and
a pair of electrodes.

4. A liquid ejecting head comprising the piezoelectric device according to claim 3.

5. A droplet ejecting apparatus comprising the droplet ejecting head according to claim 4.

* * * * *